United States Patent [19]

Armstrong

[11] 4,104,702

[45] Aug. 1, 1978

[54] KEYBOARD APPARATUS INCLUDING ELONGATED BAR FOR ALIGNING LEVEL FROM CONNECTORS TO MOTHERBOARD

[75] Inventor: James J. Armstrong, Seekonk, Mass.

[73] Assignee: Texas Instruments Incorporated, Dallas, Tex.

[21] Appl. No.: 747,653

[22] Filed: Dec. 6, 1976

[51] Int. Cl.[2] .......................... H05K 1/00; H01H 9/00

[52] U.S. Cl. .................................... 361/421; 200/5 A

[58] Field of Search ............... 361/421; 200/5 A, 5 R, 200/159 B, 283; 174/68.5

[56] References Cited

U.S. PATENT DOCUMENTS

| | | | |
|---|---|---|---|
| 3,626,132 | 12/1971 | Jungels | 200/283 |
| 3,831,063 | 8/1974 | Keough | 361/421 X |
| 3,952,174 | 4/1976 | Boulanger et al. | 200/5 A |
| 4,005,293 | 1/1977 | Boulanger | 200/5 A |

*Primary Examiner*—James R. Scott

*Attorney, Agent, or Firm*—James P. McAndrews; John A. Haug

[57] ABSTRACT

A switch assembly comprises a deformable electrically insulative substrate with a plurality of grooves formed therein extending in a direction parallel to a given axis. Electrically conductive wires are disposed in the grooves and extend beyond one end of the substrate. The grooves have a width and a depth such that the wires are accurately positioned in the substrate and securely held therein. Flexible, electrically conductive strips having a column of dome shaped portions or discs overlie the wires, each dome being formed with a centrally located projection which moves into engagement with a wire when the dome is depressed. Materials for the electrically conductive members are so chosen as to minimize corrosion problems. In the preferred embodiment, the strips are formed of a high strength brass, bus wires are of nickel containing bronze and contact wires are of nickel containing brass. A layer of electrically insulative, flexible material overlies the substrate and strips and is sealingly attached to the exposed top surface of the strips and substrate. The wires are attached to a transversely extending bar intermediate the substrate and the free end of the wires to facilitate connection to a motherboard.

10 Claims, 9 Drawing Figures

KEYBOARD APPARATUS INCLUDING ELONGATED BAR FOR ALIGNING LEVEL FROM CONNECTORS TO MOTHERBOARD

BACKGROUND OF THE INVENTION

This invention relates to switch assemblies and more particularly to pushbutton keyboard switch assemblies for use in electronic pocket calculators, telephones or the like.

In coassigned U.S. Pat. No. 4,005,293, which issued on Jan. 25, 1977, a keyboard system is disclosed which employs a generally rectangular X-Y conductor matrix. As described in that patent a plurality of actuating elements are arranged in an array of columns and rows on one face of a substrate along with a plurality of conductors on the face of the substrate. The conductors are parallel to one another and extend in the direction of the rows. There is a conductor for each row of elements and another conductor for each column of elements. Each row conductor is disposed between the substrate and the elements of its respective row. Each of the elements is of a flexible electrically conductive material and has an initial position in which it is clear of its respective row conductor. Each of the elements is resiliently deformable from its initial position to an actuated position in which at least one point of the element is in contact with its respective row conductor. The elements in each column are electrically connected to their respective column conductor, whereby upon moving any one of the elements to its actuated position, a circuit is completed between the column conductor and the row conductor of the actuated element.

While keyboards made in accordance with the disclosure of the patent are very effective it has been found that in mass producing such keyboards yields could be improved if several modifications were effected. For instance, using mass production techniques difficulty occurred in placing and maintaining the conductors in their respective grooves within the required tolerance. That is, the location of the conductor wires relative to the top surface of the substrate frequently varied more than was desirable in order to obtain satisfactory yields in the manufacturing operation. Additionally it was found that the longevity of some of the devices was limited due to corrosion problems, that is, in certain environments a film could sometimes form on the conductors or elements thereby adversely affecting the electrical switching characteristics of the switches. In general it was felt desirable to find ways to improve the manufacturing yield as well as lower the cost without adversely affecting the reliability of the keyboard system and even improve its longevity.

Thus among the many objects of the invention may be noted the provision of a keyboard having conductor wires which are disposed in a desired location relative to the top surface of a substrate with a high degree of accuracy and consistency, to provide a switching assembly of the type described which is reliable, long lived and economical to produce. Yet another object is the provision of an improved switching device which is particularly adapted for easy and accurate assembly in a keyboard system. Other objects and features will be in part apparent and in part pointed out hereinafter.

Briefly, in accordance with the invention, a keyboard system comprises a switching assembly having a deformable electrically insulative substrate with a flat top surface and a plurality of grooves molded in the top surface and extending in a direction parallel to a given axis. Electrically conductive wires having a diameter $d$ are disposed in the grooves which have a width no less than $d$ and a depth greater than $d$. The wires are securely held in position by deforming portions of the substrate adjacent the grooves onto and around the wires. Flexible, electrically conductive strips having a column of dome shaped portions or discs overlie the wires. Each strip is electrically connected to a wire as by welding to the wire which has been formed with a platform area with a weld projection thereon. Each dome is formed with a centrally located downwardly extending projection which moves into engagement with a wire when the dome is depressed. In order to minimize corrosion problems materials are specially selected. In the preferred embodiment the strips are formed of high strength brass which has suitable electrical and physical properties for the flexible members, bus wires connected to the strips are formed of nickel containing bronze and contact wires with which the domes move into engagement are formed of nickel containing brass. The substrate is preferably formed with recesses beneath each dome to prevent interference of the domes with the substrate upon depression of the domes. A layer of electrically insulative, flexible material overlies the substrate and strips and is sealingly attached to the exposed top surface of the strips and substrate.

The wires extend beyond an end of the substrate and are connected to a transversely extending elongated bar which is disposed a selected distance from the free end of the wires. The bar is formed with a stop surface in order to facilitate placement of the wires to a desired depth in mating apertures of a motherboard. The bar is preferably made of deformable material so that the wires can be forced into the bar to be securely held thereby and is provided with a flash receiving area to prevent flash material from interfering with the stop surface.

BRIEF DESCRIPTION OF THE DRAWINGS

Corresponding reference characters indicate corresponding parts throughout the several views of the drawings.

DESCRIPTION OF PREFERRED EMBODIMENTS

Figure 1:
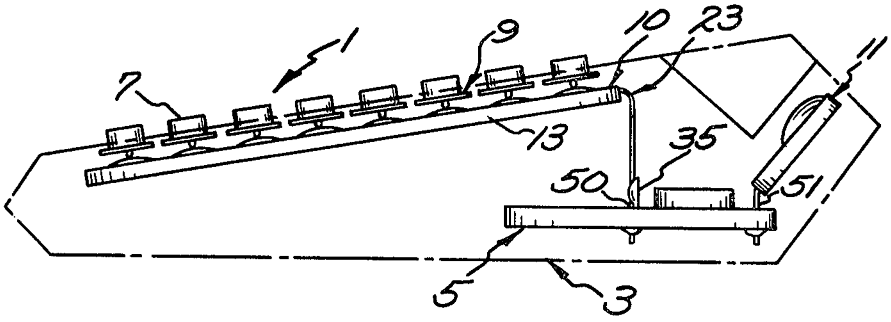
FIG. 1 is a side elevational view of a pocket calculator in which the housing is shown in phantom lines, the view showing the major components of the calculator including its case, its display module, and its motherboard carrying various electronic logic components (not shown) and in which a keyboard system of this invention is installed within the calculator case.

Referring now to the drawings, a pocket calculator, indicated in its entirety at 1, is shown to comprise a case 3 (shown in phantom) of molded synthetic resin or the like in which various electrical apparatus or electronic components (e.g., various solid state, integrated circuit and semi-conductor logic components) are mounted on a motherboard 5. Data is entered into the calculator by manually depressing desired pushbutton keys 7 of a keyboard system 9 of the present invention, and the output of data from the calculator is shown on a display 11. For example, this display may be a conventional light-emitting diode (LED) module well known in the art. The power supply for the calculator is not shown.

In accordance with the invention, keyboard system 9 comprises a switch assembly 10 having an electrically insulative substrate board 13 of deformable material such as a molded synthetic resin material, and a plurality of single-pole, single-throw (SPST) momentary switches. These switches comprise a plurality of actuating elements or dome shaped portions 17 on one face of board 13, and a plurality of electrically conductive wires on the same face of the board. These conductive wires are parallel to a given axis, e.g., the longitudinal axis of the substrate.

The dome shaped portions or discs 17 are formed in strips 19 which lie on the top surface of substrate 13 and are disposed transversely of the conductive wires. Each dome 17 is shown to be a concave-convex circular member of electrically conductive material, such as a relatively thin sheet of a high strength brass, and has an initial convex position, i.e., the center of the dome 17 is further away from the substrate than the outer margin of the dome. Preferably a projection **17*a* is formed generally in the center of each dome 17 extending toward the substrate. Each dome is movable independently of the others by resiliently depressing it partially over center from its initial convex position in which projection 17*a* is clear of the wire disposed beneath it to an actuated position (shown in dashed lines on the left hand portion of FIG. 3) in which projection 17*a* contacts the wire. Strips 19 are formed with pilot holes 17*b* which are employed in manufacturing the strips and thus need not be further described herein. Cut out portion 17*c* separates the domes of a particular strip from one another and permit actuation of one dome without affecting adjacent domes. Each strip 19 is electrically connected to a conductive wire 23** as will be explained in detail below.

Figure 2:
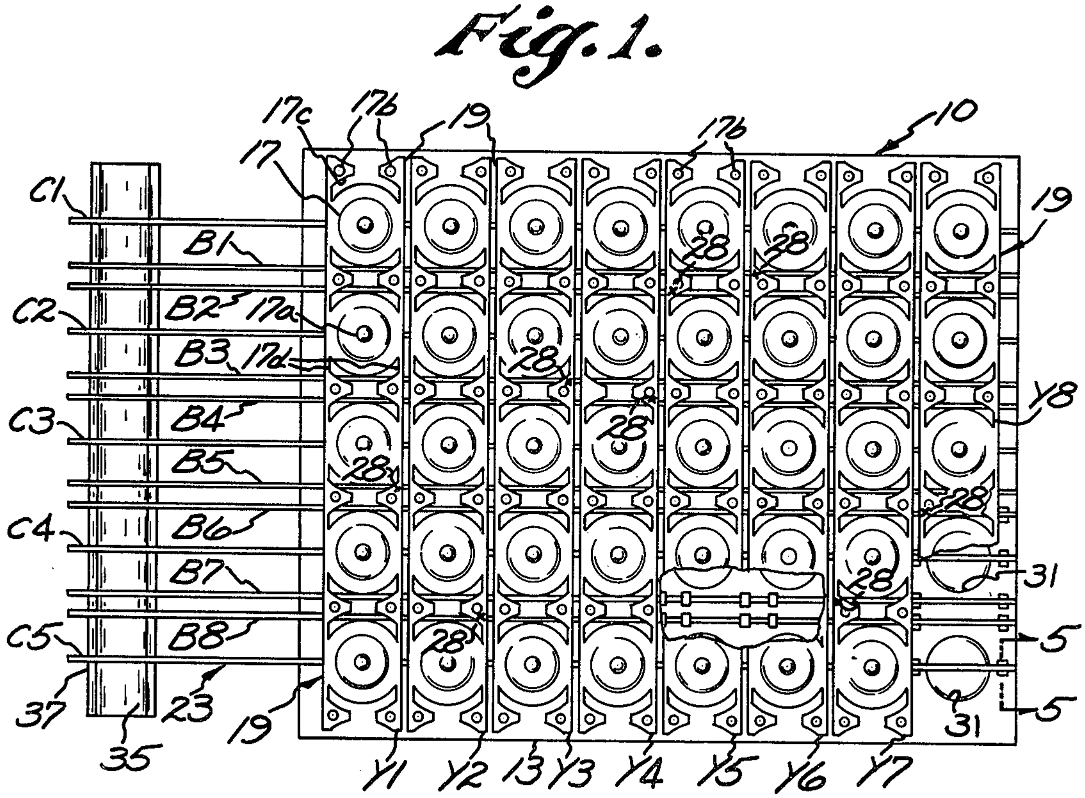
FIG. 2 is an enlarged plan view of a switching assembly used in the keyboard system of this invention with various parts broken away.

Substrate board 13 is composed of a deformable material such as plastic. Preferably the substrate board is molded with a series of grooves 21 formed therein extending longitudinally of the board parallel to a given axis e.g., the longitudinal axis of the board, for respectively receiving wire conductors 23 therein. Two groups of wire conductors 23 are mounted on the board, contact wires C1 - C5 and bus wires B1 - B8. As seen in FIG. 2, a separate bus wire is provided for each strip 19 or column of domes and a separate contact wire is provided for each longitudinally extending row of domes, for example all the domes overlying contact wire C1 constitute one such row.

Figure 4:
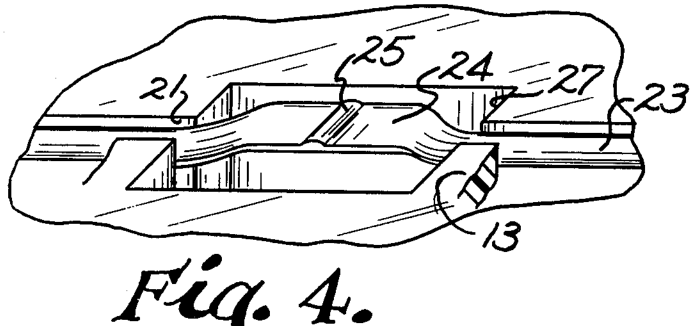
FIG. 4 is an enlarged perspective view of a portion of one of the wires in position on the substrate prior to connection with a strip of actuating domes.

As best seen in FIG. 4 a portion of a bus wire 23 is bent upwardly, as viewed in this figure, and formed with a generally flat platform 24 lying in a plane generally coplanar with the top surface of substrate 13, and weld projection 25 projecting from the platform. This operation may be performed after the wire is received in its groove 21 by providing an aperture 27 extending through board 13 to allow access for a tool which contacts the wire from the bottom and cooperates with a mating tool which contacts the wire from the top. Each strip 19 is then electrically connected to a respective bus wire by welding as indicated at 28 in FIG. 2.

Figure 5:
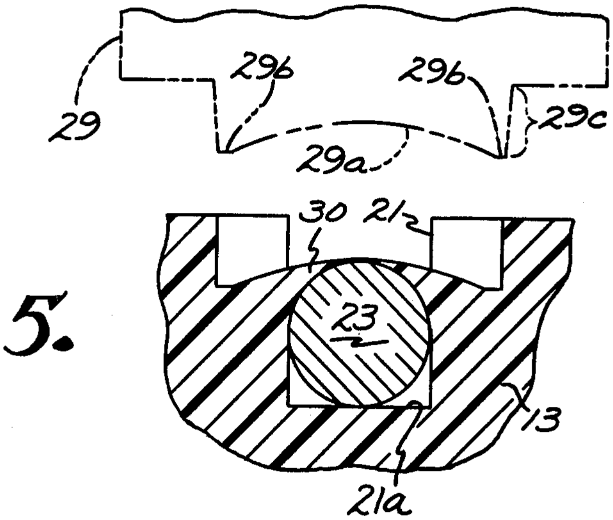
FIG. 5 is an enlarged cross sectional view of a portion of the switch assembly with a portion of a wire securing tool shown in phantom lines illustrating a wire secured in its seat.
Figure 6:
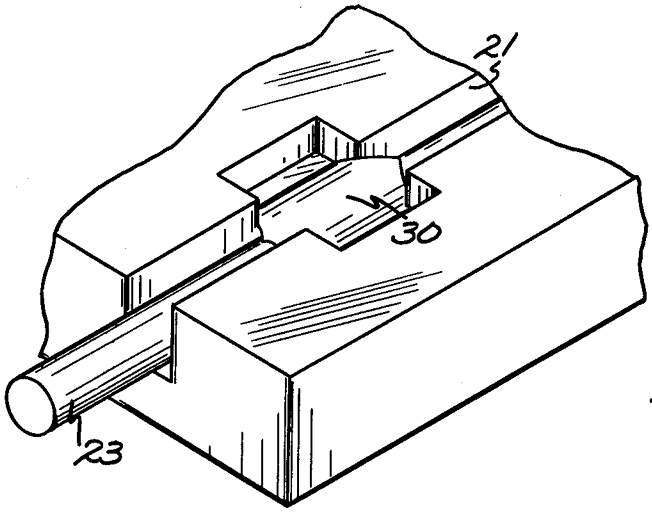
FIG. 6 is an enlarged perspective view of a portion of the switch assembly illustrating a secured wire.

Wires B1 - B8 and C1 - C5 are selected having a diameter *d* and grooves 21 are formed with a width no less than *d* and a depth greater than *d*. In the previously mentioned patent grooves are formed in the substrate board having a width slightly less than the diameter of the wire in order to firmly hold the wire in the groove when pressed therein. Although such wires are firmly held it is difficult, particularly using mass production techniques, to obtain the required accuracy in locating the wires relative to the top surface of the substrate. By employing wire having a diameter no larger than the width of the groove the wires are placed therein so that they lie on the bottom surface of the groove and are as accurately located as is the bottom surface of the groove. Since the substrate may be molded the bottom surface may be held to an extremely close tolerance relative to the top surface. After placing the wires in their respective grooves they are secured in place by deforming the substrate material located contiguous to the grooves onto the wire. As seen in FIGS. 5 and 6 an ultrasonic tool head 29 (in phantom lines) having a concavely shaped surface **29*a* extending between two ears 29*b* is brought into engagement with the substrate board 13 deforming the substrate material so that it flows onto the wire 23 as shown at 30. The diameter of surface 29*a* is larger than that of the conductive wires so that the substrate material is caused to flow into any space between the groove and the wire. The depth that tool head 29 penetrates into the substrate board, shown in FIG. 5 as 29*c* is selected so that the center of concave surface portion 29*a* nearly contacts the wire but does not force the wire below the bottom surface 21*a* of the groove. The tool head need only extend a short distance along the length of the wire, however a number of heads 29** are brought into contact with the substrate along the length of each groove so that the respective wires are securely held in a desired location by this "stitching" technique.

Selection of the depth of grooves 21 to be greater than d conveniently provides electrical isolation between the wires and the domes in their unactuated position except for those connected to the bus wires at 28. Substrate board 13 is formed with recesses 31 positioned beneath each dome in order to allow the dome to flex from its original convex position as seen in solid lines in FIG. 3 to an overcenter concave position shown in dashed lines in the switch located on the left hand portion of the Figure. Recesses 31 are preferably round in plan view having a diameter slightly less than the diameter of the domes. Upon depression of a dome its projection **17*a*** cooperates with its respective contact wire to effect engagement therewith with high contact force.

Each strip of domes Y1 - Y8 is shown to be a unitary metal member 19 having a plurality of domes or discs 17 formed therewith with a pair of metal carrier strips 17*d* extending between the domes. The remainder of the periphery of each dome is defined by a slit 17*c* so that each dome is resiliently movable overcenter to its actuated position independently of the other domes in member 19. Carrier strips 17*d* constitute means for electrically interconnecting all the domes in a strip and making all the domes in each strip electrically common with one another. Each strip 19 is electrically connected to a respective bus wire as by spot welding. Thus strip Y1 is connected to bus wire B5, Y2 to B8, Y3 to B3, Y4 to B4, Y5 to B2, Y6 to B1, Y7 to B7 and Y8 to B6. It will be seen that actuation of any dome will close a unique circuit.

It will also be understood that the particular number of strips of domes and the number of domes in a column is a matter of choice. As long as a bus wire is provided for each transversely extending strip of domes and a contact wire is provided for each row of domes extending in the direction of the wires a unique circuit can be obtained for each dome. The particular placement of the bus wires may be varied as long as they are electrically connectable to the strips.

Figure 3:
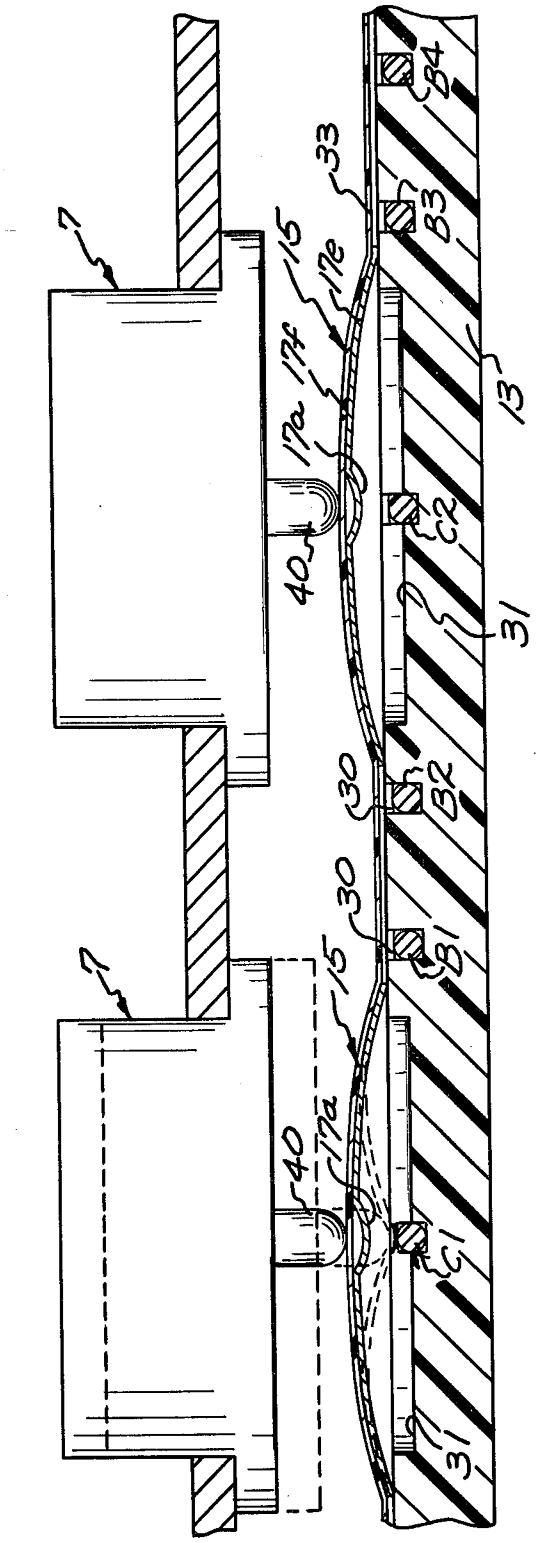
FIG. 3 is an enlarged transverse cross sectional view of a portion of the keyboard system of FIG. 1.

More particularly, as seen best in FIGS. 2 and 3 domes 17 are generally circular in plan and of dish shaped cross section having a first double curved outer surface 17*e*, such as a segment of a spheroid along the outer margin of the dome and a second double curved outer surface 17*f*, again such as a segment of a spheroid but having a larger diameter than the first surface, and a projection 17*a* extending downwardly from the center of the dome. The dome has a generally convex upper surface of curvature when they are in their initial or rest position, this convex surface being engageable by tip 40 of pushbutton keys 7. The dome has an overcenter actuated position when its center portion is subjected to a preselected deflecting force or depression and it automatically returns to its initial position upon removal of the deflecting force, whereby the element has a mechanical memory to return to its initial position. Of course, these actuating elements may have shapes other than those shown and described herein. The provision of the first and second doubled curved surface portions 17*e*, 17*f* maintains and even enhances the tactile feel of actuation by raising the effective center of the dome giving a more distinctive feel to the overcenter movement of the dome upon depression thereof. Preferably, the dome undergoes a sudden deflection from its initial to its overcentered actuated position as it establishes electrical contact with its respective contact wire. As a result of this sudden deflection, tactile feedback is provided to the operator depressing the key which may be sensed in the fingertips. Furthermore, this sudden overcentering may provide an audible signal thus indicating the pushbutton has been properly depressed to generate the desired electrical signal.

A sheet 33 of flexible electrically insulative material, such as polyethylene terephthalate, sold under the trademark "Mylar" by the E. I. Dupont de Nemours and Company is adhesively applied over strips 19 so as to adhesively hold strips 19 in position and to seal the switches. Sheet 33 preferably has a pressure sensitive adhesive coating (not shown) on its bottom face to adhesively bond it to strips 19 and to the upper surface of substrate board 13. As previously mentioned, sheet 33 is flexible and thus permits domes 17 to be freely depressed to their overcentered actuated positions. By sealing the domes with respect to the board, the contact surfaces of the domes and their respective contact wires are kept substantially free of dirt which may deleteriously affect the contact action between the domes and their respective contact wires.

In order to prolong the useful life of the keyboard system 9 the material for the dome strips as well as the contact and bus wires are chosen so that any corrosion which may occur will not affect the contact action of the switches. That is, the materials are chosen so that their electrochemical potential result in the sacrificial corrosion of the dome strips which have a much greater surface area than the bus or contact wire and therefore any resulting corrosion layer is sufficiently thin as to avoid impeding electrical switching. It will be seen that any moisture which may work its way between the substrate and sheet 33 may act as an electrolyte with ions from contaminates or from the substrate itself and thus galvanic corrosion could occur. Applicant has found that a system comprising high strength brass for strips 19 which exhibits good electrical and mechanical spring characteristics, nickel containing brass contact and nickel containing bus wires gives excellent results. Thus the dome strip is the least noble, the bus wire intermediate in nobility and the contact wire most noble. A suitable high strength brass is copper alloy No. 688 (Copper Development Association Inc. Standards Handbook), a suitable nickel containing brass is copper alloy No. 757 and a suitable nickel containing bronze is copper alloy No. 725 and a suitable brass. Thus any corrosion which occurs will occur on the dome strip which have such a large surface area that the resulting corrosion layer is so thin the electrical characteristics of the switch are not affected. An alternate material for the contact wire is a gold plated nickel.

A keyboard system made in accordance with the invention comprises a substrate of acrylonitrile-butadiene-sytrene in which grooves 21 were molded having a depth of approximately 0.026 inch, and a width of approximately 0.020 inch. Recesses 31 had a depth of approximately 0.014 inch and a diameter of approximately 0.300 inch. Domes 17 had a diameter of approximately 0.375 inch with projection 17*a* extending therefrom approximately 0.007 inch. Bus wires B1 - B8 and contact wires C1 - C5 all had a diameter of approximately 0.020 inch.

As seen in FIG. 2 conductor wires 23 extend beyond one end of board 13. These wire ends or extensions are bendable and constitute connector pins adapted to be inserted directly into mating connecting terminal receptacles 50 in motherboard 5 for interfacing the keyboard and the motherboard. In order to facilitate insertion of the wire ends into receptacles 50 the wires are attached to a transversely extending bar 35 (see FIGS. 1 and 7). The wires may be attached to the bar in any suitable manner but preferably the bar is formed of deformable resinous material of the same type as substrate 13 so that the wires may be forced into the bar by an ultrasonic tool. Bar 35 is provided with a stop surface 37 which enables insertion of the wires into their mating receptacle 50 to the desired depth. That is, the wires ae aligned with their receptacles and inserted until bar 35 meets motherboard 5. Bar 35 also minimizes dislocation of conductor wires 23 prior to insertion in receptacles 50 which greatly facilitates mass construction processing. It will be noted that bar 35 is formed with a flash receiving area 39. When the bar material is deformed upon embedding of the wires therein the displacement material will be received in area 39 without interfering with stop surface 37.

Figure 7:
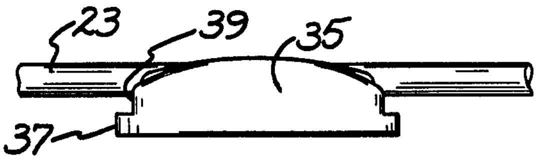
FIG. 7 is a side elevational view of a member attached to the wires intermediate the switch assembly substrate and the free end of the wires.

As seen in FIG. 7 right and left hand sides of bar are mirror images of one another so that either side can be used for the stop surface which further facilitates handling without introducing any chance of improper orientation of the bar relative to the motherboard.

Figure 8:
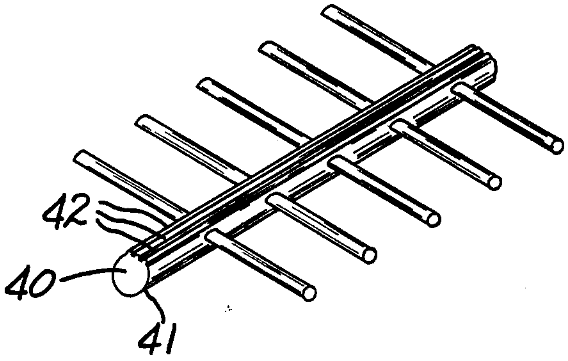
FIG. 8 is a perspective view of an alternative member attached to the wires intermediate the switch assembly substrate and the free end of the wires.
Figure 9:
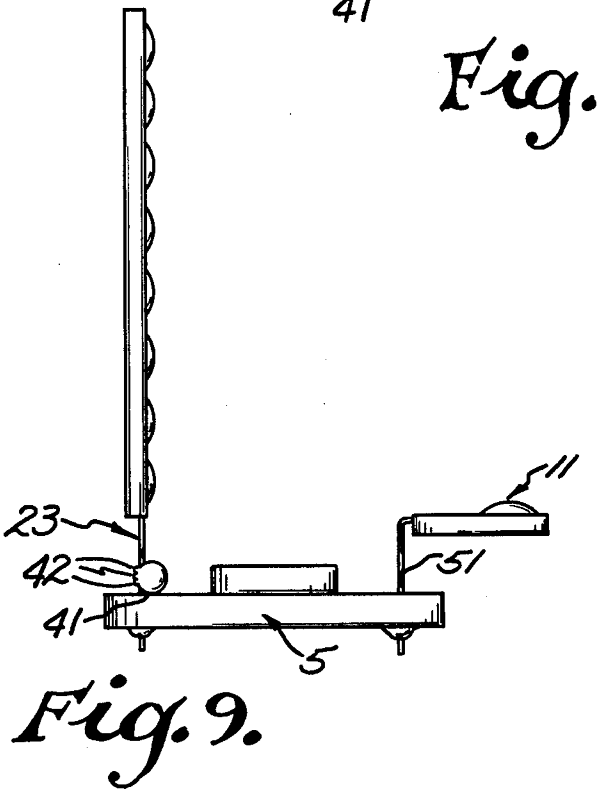
FIG. 9 illustrates a switch assembly of the invention and a display module connected to the motherboard of the calculator or the like preparatory to being simultaneously soldered to the motherboard.

FIG. 8 shows an alternative embodiment of the wire holding bar member. Rod 40, also disposed transversely across the several conductor wires 23, is generally round in cross section so that for any rotational position along the longitudinal axis of rod 40 a line portion 41 (see FIG. 9) will act as the stop portion and the curved surface adjacent line 41 will define the flash receiving area. Longitudinally extending beads 42 are formed in rod 40 by an ultrasonic tool when wires 23 are embedded thereon to securely hold the wires in place.

Because all the bus and contact wires exit from the same end of board 13, no additional connectors, such as umbilical wires, are needed to electrically connect the keyboard of this invention to a motherboard or to other electronic components. Specifically, conductor wire extensions need only be inserted in their respective terminal receptacles in the motherboard and soldered in place. A further advantage of the keyboard system of this invention is that with the wire ends inserted in terminal receptacles at one end of the motherboard with conductor ends 51 of display 11 inserted into corresponding terminal receptacles 50 at the other end of the motherboard, the conductor leads for both the keyboard and the display can be simultaneously soldered to the motherboard in conventional wave soldering apparatus. After soldering, the wires may be bent so that the keyboard system 9 overlies motherboard 5 in position, as shown in FIG. 1, for actuation by keys 7.

Use of a molded substrate board 13 which may be of an inexpensive, relatively low melting temperature, deformable thermoplastic resin such as acrylonitrile-butadiene-styrene (ABS) styrene or the like, enables the provision of very accurate seats for conductor wires 23 which enhance uniform switch action. Since the wires are readily received in their respective grooves 21 in substrate 13, and since these conductors are securely held in accurate position by the stitching, a keyboard is provided which is easily manufactured using mass production techniques while maintaining extremely close tolerances.

In view of the above, it will be seen that the several objects of the invention are achieved and other advantageous results attained.

As various changes could be made to the above constructions without departing from the scope of the invention, it is intended that all matter contained in the above description or shown in the accompanying drawings shall be interpreted as illustrative and not in a limiting sense.

I claim:

1. A switch assembly comprising a base member, switching stations disposed on the base member, a plurality of electrically conductive wires supported by the base member each having a free end extending beyond the base member in a direction parallel to a given axis, the wires providing means for electrically connecting the switches to a motherboard, a spacer bar having a stop surface extending along its length disposed intermediate the free ends of the wires and the base member, the wires attached to the bar a selected distance from the free ends of the wires so that the stop surface extends in a direction generally perpendicular to the given axis whereby bending of the wires prior to assembly of the switch assembly to the motherboard is minimized as well as providing a stop surface so that a given length of each wire is presented for connection to the motherboard.

2. A switch assembly according to claim 1 in which the bar is composed of deformable material and the wires are forced into the bar.

3. A switch assembly according to claim 2 further including means to accommodate flashing which occurs when the wires are forced into the bar, the flashing accommodate so that it does not interfere with the stop surface.

4. A switch assembly according to claim 3 in which the means to accommodate flashing comprises a cut away portion of the bar adjacent the stop surface.

5. A switch assembly according to claim 3 in which the bar is circular in cross section to provide the means to accommodate flashing.

6. An electronic module assembly comprising a motherboard and a switch assembly module, the motherboard having terminal apertures therein for reception of conductors from the switch assembly module, the conductors extending from the switch assembly module lie in a plane, extend in a direction parallel to one another and terminate in an end portion, the improvement comprising guide means integral with the conductors to facilitate proper connection of the conductors to the motherboard, the guide means comprising a bar attached to the conductors a selected distance from the end portions thereof, the bar having a longitudinal axis generally perpendicular to the direction of the conductors whereby bending of the conductors prior to their connection to the motherboard is minimized and a stop surface is provided so that a given length of each conductor is presented for connection to the motherboard.

7. An electronic module assembly according to claim 6 in which the bar is comprised of deformable material and the conductors are forced into the bar.

8. An electronic module assembly according to claim 7 further including means to accommodate flashing which occurs when the conductors are forced into the bar, the flashing accommodate so that it does not interfere with the stop surface.

9. An electronic module assembly according to claim 8 in which the means to accommodate flashing comprises a cut away portion of the bar adjacent the stop surface.

10. An electronic module assembly according to claim 8 in which the bar is generally circular in cross section to provide means to accommodate flashing.

* * * * *